(12) United States Patent
Bakovic et al.

(10) Patent No.: US 11,005,360 B2
(45) Date of Patent: May 11, 2021

(54) APPARATUS AND METHOD FOR MONITORING A SAFETY FUNCTION OF A MACHINE OR TECHNICAL INSTALLATION

(71) Applicant: PILZ GMBH & CO. KG, Ostfildern (DE)

(72) Inventors: Daniel Bakovic, Ostfildern (DE); Matthias Schweiker, Ostfildern (DE); Uwe Schoch, Ostfildern (DE); Juergen Pullmann, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 0 days.

(21) Appl. No.: 16/692,557

(22) Filed: Nov. 22, 2019

(65) Prior Publication Data

US 2020/0177072 A1     Jun. 4, 2020

(30) Foreign Application Priority Data

Nov. 26, 2018  (DE) ............. 10 2018 129 796.3

(51) Int. Cl.
*H02M 1/36* (2007.01)
*G01R 19/165* (2006.01)
(Continued)

(52) U.S. Cl.
CPC ........ *H02M 1/36* (2013.01); *G01R 19/16538* (2013.01); *G06F 1/28* (2013.01);
(Continued)

(58) Field of Classification Search
CPC ............ H02H 3/207; H02H 1/06; H02H 3/05; H02H 1/0007; G06F 1/28; H02M 1/36; G01R 19/16538
See application file for complete search history.

(56) References Cited

U.S. PATENT DOCUMENTS 5,488,531 A * 1/1996 Aldridge ............... H02J 1/10
361/18
5,513,062 A  4/1996 Paul et al.
(Continued)

FOREIGN PATENT DOCUMENTS

DE          10016712 A1    10/2001
DE     102008018642 A1    10/2009
(Continued)

OTHER PUBLICATIONS

Din En Iso 12100-1; Safety of machinery; Apr. 2004; 39 pp.
(Continued)

*Primary Examiner* — Harry R Behm
(74) *Attorney, Agent, or Firm* — Harness, Dickey & Pierce, P.L.C.

(57) ABSTRACT

Apparatus for voltage monitoring of a dual-channel device which implements or monitors a safety function of a machine or technical installation. The apparatus comprises an input for receiving an input voltage, a voltage regulator for generating a defined output voltage, and an output for providing the defined output voltage for the operation of the device. A voltage monitor compares a voltage present at the output with the defined output voltage and switches off the output in case the present voltage at the output deviates from the defined output voltage. A first interface and a second interface connect the voltage regulator to the dual-channels of the device, wherein the first interface and the second interface connect to a first processing channel and a second processing channel of the device separately so that the first processing channel and the second processing channel of the device can detune the voltage regulator independently.

15 Claims, 4 Drawing Sheets

(51) Int. Cl.
    *H02H 1/00*    (2006.01)
    *H02H 3/20*    (2006.01)
    *H02H 1/06*    (2006.01)
    *H02H 3/05*    (2006.01)
    *G06F 1/28*    (2006.01)

(52) U.S. Cl.
    CPC ............ *H02H 1/0007* (2013.01); *H02H 1/06* (2013.01); *H02H 3/05* (2013.01); *H02H 3/207* (2013.01)

(56) References Cited

U.S. PATENT DOCUMENTS

| | | | |
|---|---|---|---|
| 2010/0073004 | A1 | 3/2010 | Miyamoto |
| 2015/0340854 | A1* | 11/2015 | Richter .................. H02H 3/20 361/86 |
| 2016/0268828 | A1* | 9/2016 | Mao .......................... H02J 7/02 |
| 2020/0099215 | A1* | 3/2020 | Ishino .................. H02H 1/0007 |

FOREIGN PATENT DOCUMENTS

| | | |
|---|---|---|
| EP | 0 614 049 A1 | 9/1994 |
| EP | 2 117 094 A2 | 11/2009 |
| EP | 2182604 A1 | 5/2010 |
| JP | 57025012 A | 2/1982 |
| JP | 201078390 A | 4/2010 |
| JP | 2014230451 A | 12/2014 |
| JP | 2016513444 A | 5/2016 |
| WO | WO-2011158897 A1 | 12/2011 |

OTHER PUBLICATIONS

En Iso 13849-1; Safety of machinery—Safety-related parts of control systems—Part 1: General principles for design (ISO 13849-1:2006); Nov. 2006; 97 pp.

* cited by examiner

APPARATUS AND METHOD FOR MONITORING A SAFETY FUNCTION OF A MACHINE OR TECHNICAL INSTALLATION

CROSS-REFERENCES TO RELATED APPLICATIONS

This application claims priority from German patent application DE 10 2018 129 796.3 filed on Nov. 26, 2018. The entire content of the priority application is incorporated herein by reference.

BACKGROUND OF THE INVENTION

This disclosure relates to an apparatus and a method for monitoring the voltage of a device which implements or monitors a safety function of a machine or technical installation and has at least two processing channels, and the corresponding device.

In industrial automation or process technology, devices must be provided which serve to reduce the risk posed by technical installations to people and the environment. For this purpose, safety functions are implemented that bring a technical installation or a safety-critical process into a safe state in the event of a danger. Under the term safety function, the relevant standards DIN EN ISO 13849-1 and DIN EN ISO 12100 define a safety-related control function of a machine that reduces a risk emanating from the machine to an acceptable level. A safety function, for example, is the shutdown of a machine after pressing an emergency stop button.

Originally, safety functions were initially implemented by individual safety components, for example in the form of safety switching devices with relay technology. These were and are still used today independently of a control system for the system to be monitored. They essentially act automatically and independently of any controller and, in the event of danger, switch off the technical installation by disconnecting a power supply. In further development, safety switching devices were then logically linked to each other in order to implement even more complex safety functions. Today, safety controllers are used for even more complex tasks. Similar to a programmable logic controller (PLC), safety controllers can be interconnected by programming. A safety controller regularly differs from a PLC control system by having two separate channels, a diverse structure with different hardware, continuous testing of inputs and outputs, continuous comparison of user data, voltage and time monitoring and safe shutdown in the event of a fault or danger.

In the sense of this disclosure, safety relays, configurable safety relays and safety controllers are commonly understood as safety devices. To power the electrical components of these safety devices, in particular to power the processing units, most of which are designed as microcontrollers, the safety devices have voltage regulators which convert an externally provided supply voltage, e.g. 24 volts, into smaller operating voltages, e.g. 3.3 volts, 5 volts, 12 volts or 24 volts, depending on which operating voltage is required for the operation of the electrical components.

For digital systems such as microcomputers and microprocessors, it is important that they are only activated when their operating voltage has reached a defined level. A drop or collapse of the operating voltage can lead to faulty operation of these systems and thus impair the safety function provided.

Safe voltage monitoring is therefore an essential part of all safety devices and must always be integrated into a safety concept. This makes it all the more important to provide a voltage monitoring concept that is very simple, cost-effective to implement and highly reliable.

SUMMARY OF THE INVENTION

It is an object of the present disclosure to specify a voltage monitoring concept, which is simple and reliable and can be implemented cost-effectively. Furthermore, it is an object to provide corresponding apparatuses and methods implementing the monitoring concept.

According to one aspect of the present disclosure, there is provided an apparatus for monitoring the voltage of a device which implements or monitors a safety function of a machine or technical installation and has at least two processing channels, comprising: an input for receiving an input voltage, a voltage regulator for generating a defined output voltage from the input voltage, an output for providing the defined output voltage for operating the device, and a voltage monitor which is configured to compare a voltage present at the output with the defined output voltage and to switch off the output in the event that the present voltage deviates from the defined output voltage. The apparatus further comprises a first interface and a second interface for connecting the voltage regulator to the at least two processing channels of the device, wherein the first interface and the second interface are configured to connect to a first processing channel and a second processing channel of the at least two processing channels of the device separately so that the first processing channel and the second processing channel can detune the voltage regulator independently.

According to a further aspect, there is provided a method for voltage monitoring of a device that implements or monitors a safety function of a machine or technical installation and has at least two processing channels, with the steps:

Receiving an input voltage at an input;
Generating a defined output voltage from the input voltage with a voltage regulator;
Providing the defined output voltage at an output for the operation of the device;
Comparing a voltage present at the output with the defined output voltage using a voltage monitor;
Switching off the output if the voltage present at the output deviates from the defined output voltage; and
Connecting the voltage regulator to the at least two processing channels of the device via the first interface and the second interface, wherein the first interface and the second interface connect to a first processing channel and a second processing channel of the at least two processing channels of the device separately so that the first processing channel and the second processing channel can detune the voltage regulator independently.

It is therefore an idea to monitor the voltage regulator with a voltage monitor in a single-channel manner, whereas the voltage monitor itself is tested in a dual-channel manner. Thereby, safe voltage monitoring can be implemented which meets the requirements of higher safety categories of the safety standards mentioned at the outset.

At the same time, the additional voltage monitoring tests can be carried out at low cost taking advantage of the two-channel processing of the safety device. A redundant design of the power supply itself or its monitoring can thus be avoided and implementation costs can be reduced.

Via interfaces that are directly connected to the voltage regulators, the tests can be easily performed directly on the components used for voltage monitoring. The tests can be carried out with little effort by the safety device and can therefore also be carried out by less powerful processing units. The apparatus can therefore be used flexibly for different safety devices, ranging from a simple safety switching device to a programmable safety controller.

In a further refinement, switching off the output by the voltage monitor can result in execution of the safety function. Since switching off the output leads to the safety function being executed, the voltage monitoring and its checking can be easily implemented, since in the event of a fault only the output has to be switched off in order to set a safe state. This means that no additional switch-off path must be implemented, nor must the voltage monitor be aware of the implementation of the safety function itself. Voltage monitoring can thus be kept simple.

In a further refinement, the voltage regulator can be connected to a resistor network and detuning the voltage regulator may include adjusting the defined output voltage of the voltage regulator via the resistor network. A resistor network, which provides different resistance values at defined terminals depending on the wiring, can be implemented easily and at low cost. Detuning the voltage regulators becomes particularly easy this way. This design thus further contributes to a cost reduction of the apparatus.

In a further refinement, the apparatus can further comprise a first switching element and a second switching element each operable in response to a signal present at the first interface or the second interface, wherein the voltage regulator can be detuned by the operation of the first switching element or the second switching element. Switching elements can be easily actuated and have low requirements on the signals controlling them. Detuning the voltage regulator becomes thus particularly easy without having to use a complex control signal. Further, this allows the voltage monitoring tests to be carried out by simple safety devices and makes low demands on the performance of the processing units used within the processing channels.

Preferably, actuating the first switching element and the second switching element changes the voltage present at the output by a defined amount. By changing the voltage applied to the output by a defined amount, the switching elements can easily set an undervoltage or an overvoltage for test purposes.

Preferably, the voltage regulator provides the defined output voltage when the first switching element is actuated and the second switching element is not actuated, a defined undervoltage which is less than the defined output voltage when the first and second switching elements are actuated, and a defined overvoltage which is greater than the defined output voltage when the first switching element is not actuated and the second switching element is actuated. By using switching elements, which can be controlled separately by the two processing channels, both an undervoltage and an overvoltage can be generated easily. This makes it particularly easy to control the interfaces and carry out the tests.

In a further refinement, the apparatus can comprise a capacitor disposed at the output and configured to hold the defined output voltage for a defined period of time when the voltage monitor switches off the output. As a buffer capacitor, the capacitor causes the present voltage not drop immediately when the output is switched off, but to remain available for a defined period of time. In this way, a test can be performed which, in proper operation, would cause the output to be switched off. However, due to the capacitor, the shutdown does not lead to the actual execution of the safety function, e.g. the shutdown of the system. Thus availability of the safety device is not affected by the tests.

In a further refinement, the device may comprise a third interface and a fourth interface which can be connected separately to the first processing channel and the second processing channel and at which the voltage present at the output can be accessed. Accessing the voltage present at the output separately enables a dual-channel read-back, so that the evaluation of the tests can be carried out in a dual-channel manner by the two existing processing channels.

In a further refinement, the device can comprise a communication interface, e.g. a USB interface, which provides an operating voltage as input voltage and which may be used to implement or to monitor the safety function. This design is advantageous for simple safety devices, which, for example, are only designed to monitor another device. By providing the operating voltage from a communication interface such as a USB interface, the device can be realized with a single interface, and the implementation of the device can thus be simplified.

Preferably, the device can be a monitoring device which is designed as a dongle, such as a USB stick, and which comprises a housing in that a first microcontroller and a second microcontroller can be enclosed as processing units. Such a device can be designed to safeguard the execution of a safety function implemented by user programs on a platform, wherein the monitoring device is connectable to the platform via a first communication interface and executes at least one fail-safe service independently of the platform via which the monitoring device cooperates with a fail-safe peripheral module, so that the fail-safe peripheral module can put the machine or technical installation into a safe state based on the implemented safety function on the platform and the fail-safe service. This refinement is advantageous, as the safety device can be distributed over several components. This means that an effective execution of a safety function, which is implemented in software, can take place via a powerful, but not necessarily intrinsically safe, platform, while the safety-related safeguarding is shifted to simple, but fail-safe, peripheral devices that interact with the platform.

It goes without saying that the features mentioned above and the features to be explained below can be used not only in the combination indicated, but also in other combinations or uniquely, without leaving the scope of this invention.

BRIEF DESCRIPTION OF THE DRAWINGS

Exemplary embodiments of the invention are shown in the drawings and are explained in more detail in the following description. In the drawings.

DETAILED DESCRIPTION OF THE PREFERRED EMBODIMENTS

Figure 1:
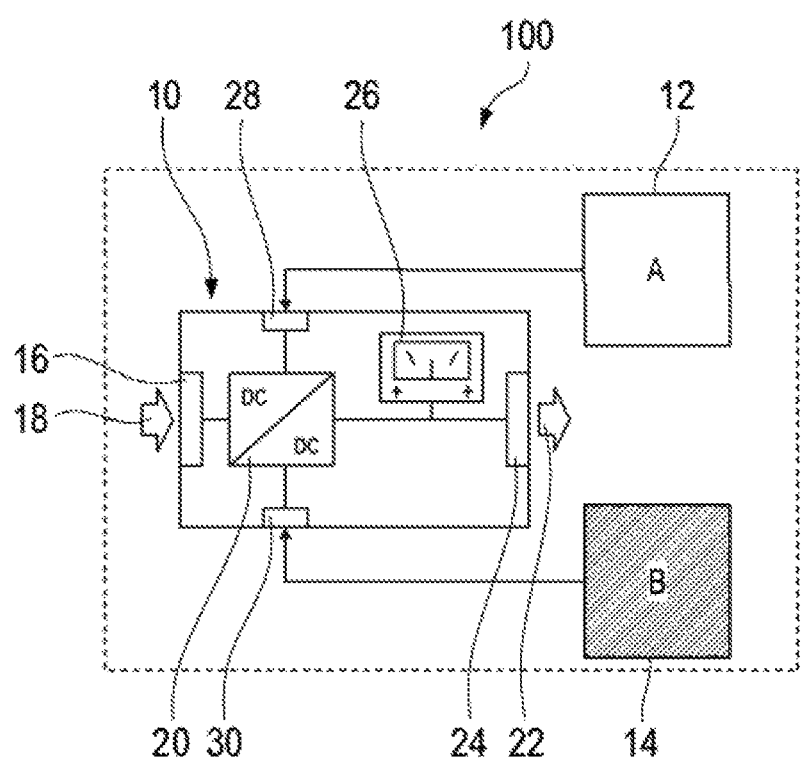
FIG. 1 shows a safety device with an exemplary embodiment of the apparatus.

FIG. 1 shows a safety device in which an exemplary embodiment of the apparatus is implemented. In FIG. 1, the safety device is denoted in its entirety with reference numeral 100 and the apparatus is denoted with reference numeral 10.

The safety device 100 implements a safety function to safeguard a technical installation or a safety-critical process (not shown here). The term "safety function" refers to a safety-related control function that is performed manually or automatically in a hazardous situation in order to put a machine or a safety-critical process into a safe state. A safety function, for example, is the shutdown of a machine after pressing an emergency stop button.

The safety function is processed redundantly by two processing channels 12, 14, which may monitor each other. The channels are referred to here as channel A and channel B. Processing can be carried out, for example, by parallel and separate execution of user programs on processing units, such as microcontrollers, of the processing channels.

To operate the electrical components of the safety device a safe power supply is required, which is implemented here by means of an exemplary embodiment of the apparatus 10. The apparatus 10 can be integrated into the safety device 100 as shown here and can be enclosed within the enclosing housing of the safety device 100 so that the safety device 100 forms a combined unit with the apparatus 10. In another embodiment, the apparatus can also be a stand-alone unit with its own housing, and being connected via one or more interfaces to the safety device 100, in particular to the processing channels and a power supply of the safety device 100.

The apparatus 10 has at least one input 16 via which the apparatus 10 can receive an input voltage 18. The input voltage 18 can be a supply voltage of the safety device, for example, a 24 V supply voltage frequently used in automation technology, or any other DC or AC voltage.

The main task of the apparatus 10 is to convert the input voltage via a voltage regulator 20 into a defined output voltage 22, which can be constant, i.e. independent of the input voltage 18, and stable, i.e. independent of the current consumption. During normal operation, the voltage regulator 20 generates a defined output voltage 22 which corresponds to the operating voltage of the safety device 100 and is suitable for operating the electrical component used by the safety device 100. An operating point of these electrical components can be, for example, 3.3V. It goes without saying that in another embodiment, the safety device can require several operating voltages for operation and these can be provided as output voltages of the apparatus. Each individual output voltage can then be monitored in the manner described below.

The output voltage is provided at an output 24 and is simultaneously monitored by a voltage monitor 26. The voltage monitor 26 is configured to switch off the output as soon as the measured voltage at output 24 deviates from the defined output voltage by a defined amount. In other words, if the defined output voltage cannot be provided due to an overvoltage or undervoltage, no voltage is applied to the output, causing the safety device to adopt the safe state defined by the safety function, e.g. shutting down the monitored technical installation. In this way, it can be ensured that the electrical components of the safety device 100 are supplied exclusively with the operating voltage required for operation.

To guarantee proper function of the voltage monitor 26, the voltage monitor itself must be tested. For this purpose, the apparatus 10 comprises a voltage regulator 20 which is adjustable, i.e. whose output voltage can be changed by specific control. In addition, the apparatus 10 comprises a first interface 28 and a second interface 30 via which the voltage regulator 20 can be connected to the two processing channels 12, 14 of the safety device 100.

The voltage regulator 20 can be "detuned" via the interfaces 28, 30, i.e. the voltage regulator 20 can be controlled via the first interfaces 28 and the second interface 30 in such a way that on the one hand an undervoltage which is smaller than the defined output voltage and on the other hand an overvoltage which is larger than the defined output voltage can be provided by the voltage regulator 20.

The overvoltage or undervoltage is selected so that if these voltages are applied at the output 24 of the apparatus, the voltage monitor 26 will respond. In other words, the processing channels 12, 14, i.e. in particular the user programs executed in the respective channel, can independently set the voltage regulator 20 so that the voltage monitor 26, if functioning properly, switches off the output 24. In this way, the voltage monitor 26 can be tested independently and redundantly by taking advantage of the two processing channels.

By the dedicated control of the voltage regulator 20, the functionality of the voltage monitoring can be tested by the voltage monitor 26, whereby a faulty voltage monitoring can be identified. The intrinsic error safety of the safety device 100 can thus be increased. By taking advantage of the existing processing channels of the safety device 100, the self-test of the voltage monitoring can be implemented effectively and with low cost.

Figure 2:
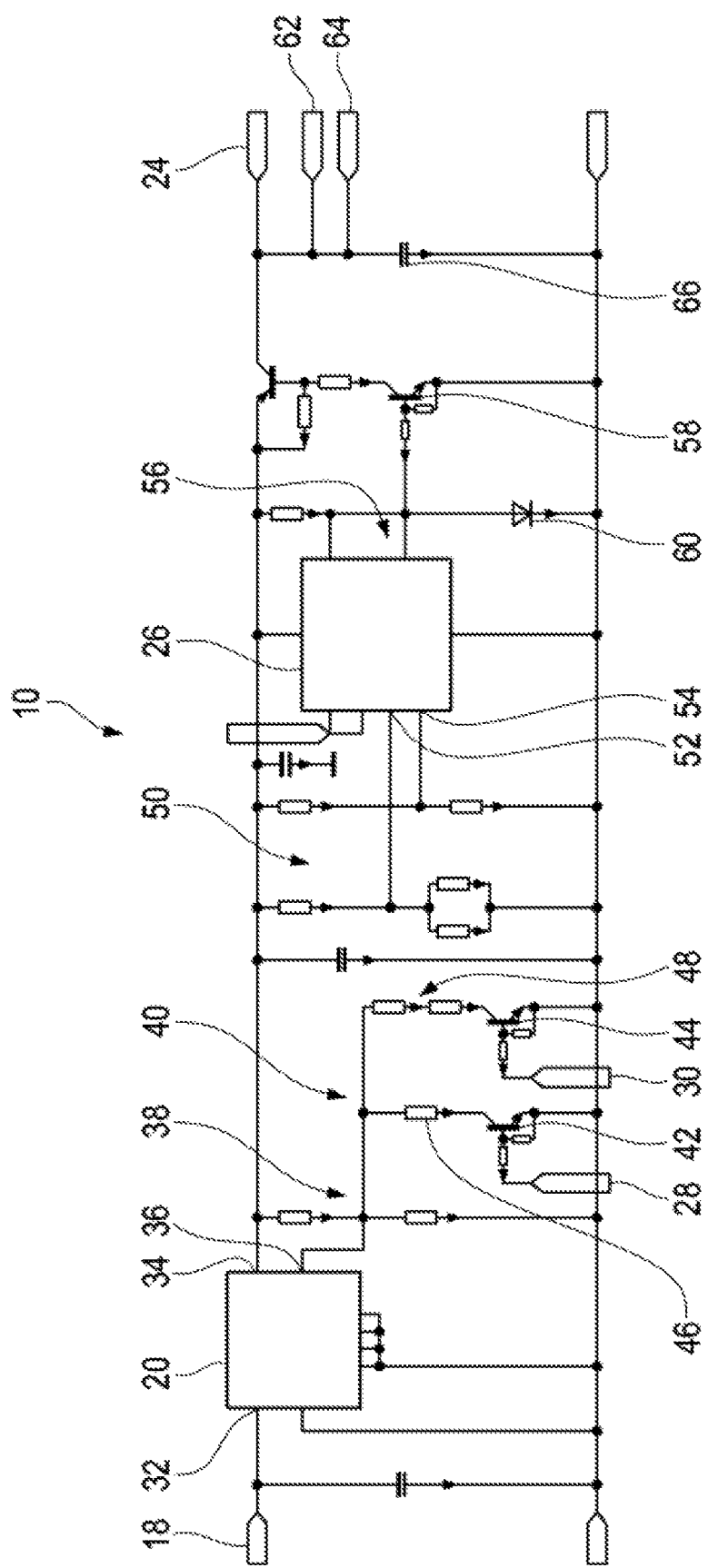
FIG. 2 shows an implementation of an exemplary embodiment of the apparatus.

FIG. 2 shows an exemplary embodiment of the apparatus as a circuit diagram. Same reference signs denote the same parts as before with respect to FIG. 1.

In this example, the voltage regulator 20 is a regulator designed as an integrated circuit. An input voltage 18 is fed to the voltage regulator 20 via a first terminal 32. The converted defined output voltage 22 can be accessed at a second terminal 34. A third terminal 36 is used for the specific control of the voltage regulator 20, via which the output voltage provided at the second terminal 34 can be adjusted. For adjustment, a control voltage is applied to the third terminal 36 via a voltage divider 38. In this example, the control voltage can be set via a resistor network 40 by adding or removing resistors to the voltage divider 38.

Adding and removing resistors is done by a first switching element 42 and a second switching element 44. The first switching element 42 connects a first resistor 46 in parallel with a resistor of the voltage divider 38 and the second switching element 44 connects a second resistor 48 in parallel with the resistor of the voltage divider 38 independently of the first resistor 46. By adding and removing resistors from the total resistor of the voltage divider 38, a control voltage can be changed at the third terminal 36, and thereby the output voltage provided at the second terminal 34 can be "manipulated". In particular, depending on the switch position of the first switching element 42 and the second switching element 44, a defined overvoltage or a defined undervoltage at the second terminal 34 can be set.

The first switching element 42 is connected here to a first interface 28 and the second switching element 44 is connected to a second interface 30. The switching elements 42, 44 can be operated via the interfaces 28, 30 selectively. It is thus possible to set a defined undervoltage or overvoltage via the two interfaces 28, 30. The first resistor 46, the second resistor 48 and the voltage divider 38 can be designed so that when the first switching element 42 is not actuated and the second switching element 44 is actuated, the defined output voltage, e.g. 3.6 V, is applied to the second terminal 34. If, on the other hand, the first switching element 42 and the second switching element 44 are both actuated, an undervoltage will occur at the second terminal 34, for example a voltage of less than 3.2 V. If the first switching element 42 is actuated and the second switching element 44 is not actuated, an overvoltage will occur at the second terminal 34, which for example is above 3.9 V.

It goes without saying that the implementation shown here is only one way to generate an under- or overvoltage related to the defined output voltage. In other exemplary embodiments, the voltage regulator 20 can also be controlled directly or indirectly by other means in order to be "detuned". The decisive factor is that the control can be carried out independently by at least two processing channels in order to enable a redundant test in dual-channel manner.

The overvoltage or undervoltage can be detected by the voltage monitor 26. The voltage monitor 26 can be designed as an integrated circuit. In principle, the voltage monitor 26 can be implemented by two threshold switches that perform an action or switch an output terminal when a first threshold value is exceeded, i.e. in the event of an overvoltage, or when falling below a second threshold value, i.e. when an undervoltage is present. The action may cause an output 24 to be switched off.

The threshold values for overvoltage and undervoltage are set here by a further resistor network 50 depending on the output voltage provided at the second terminal 34 and provided to the voltage monitor 26 at a first input terminal 52 and a second input terminal 54. The action is executed via further output terminals 56 of the voltage monitor 26. In the example shown here, the output terminals 56 control a further switching element 58, via which the output 24 can be separated from the second terminal 34 of the voltage regulator 20.

It goes without saying that the voltage monitoring does not have to be implemented as an integrated circuit, as shown in FIG. 2. Other versions of the voltage monitor, e.g. with discrete components, are conceivable.

The state of the output terminals 56 can be made visible via a LED 60, as in this example. In addition, a third and fourth interface 62, 64 can be provided, via which the voltage present at the output 24 can be accessed independently. This enables separate read-back of the output 24 by the first processing channel 12 and the second processing channel 14.

Preferably, the safety device is thus connected to the apparatus 10 via the first, second, third and fourth interface 28, 30, 62, 64. The first interface and the third interface 28, 62 are connected to a first processing channel 12 of the safety device 100 and the second interface and the fourth interface 30, 64 are connected to a second processing channel 14 of the safety device 100. The voltage monitor 26 can thus be tested in dual-channel manner and the test results can be read back in dual-channel manner, while the voltage monitor 26 itself is configured in single channel manner.

Dual-channel testing is performed by the safety device 100 by actuating the first switching element 42 and the second switching element 44 in the manner described above to generate specific overvoltages and undervoltages for a defined period of time. Via the third interface 62 and the fourth interface 64, the processing channels 12, 14 can additionally read back the voltage value applied to the output independently of each other in order to check whether the voltage monitor 26 reacts as expected to the detuning of the voltage regulator 20. It goes without saying that instead of a dual-channel read-back, the safety function can also be performed directly by the voltage monitor 26.

The tests by applying the overvoltage or undervoltage result in the output 24 being switched off during proper operation of the voltage monitor 26, which in turn causes the safe state to be assumed by the safety device 100. In order to avoid the actual execution of the safety function by the tests, an additional capacitor 66 can be arranged at the output 24, which buffers the voltage at the output 24 for a defined period of time, at least for the defined period of the overvoltage or undervoltage. For example, the capacitance of the capacitor can be dimensioned so that a switched-off output voltage is bridged for 10 ms.

The output 24 is then read back by the safety device based on the discharge behavior of the capacitor and may be explicitly adjusted to the discharge behavior of the capacitor for a more precise determination. In other words, a successful test can be linked not only to the fact that the capacitor 66 discharges, but also to whether the capacitor discharges as expected.

It goes without saying that capacitor 66 is only one way of bridging a voltage supply at the output 24. Alternatively, other energy storage devices can be used in combination with a suitable selection of the respective test duration or test period. A bridging by means of a capacitor 66 can, however, be implemented robustly with low cost.

Figure 3:
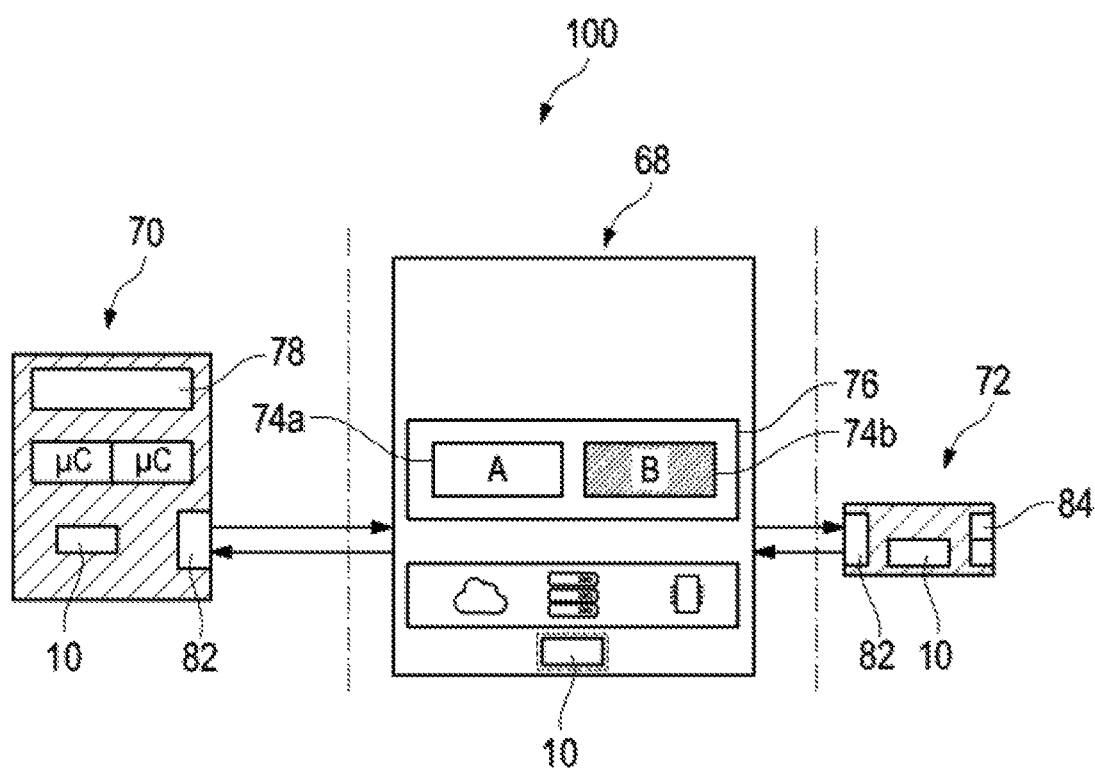
FIG. 3 shows an application scenario with an exemplary embodiment of the apparatus.

FIG. 3 shows an application scenario in which apparatuses according to the present disclosure can be used. The same reference signs denote the same parts as before.

FIG. 3 shows a safety device 100 which is made of three separate and individual components. The three components include a platform 68, a monitoring device 70 and a fail-safe peripheral module 72. The aim of splitting the safety device 100 into separate components is to execute a safety function primarily implemented in software on an arbitrary platform 68, in particular a non-safe platform, while the execution is safeguarded primarily by platform-external components. These external components, which are relevant for safety and which are particularly implemented as dedicated hardware, can be designed as elementary as possible in order to be implemented in a cost-conscious manner. At the same time, an administrative burden for certifying these components according to the relevant standards can be kept low.

All in all, the safety device 100 can implement complex safety functions at low cost, as safety is "encapsulated" in separate components. In other words, it is possible to implement the complex design of a safety function predominantly in software on a cost-effective platform and to outsource the required intrinsic error safety to easily implementable components that can be certified with little effort.

The external platform components, i.e. the monitoring device 70 and the fail-safe external peripheral module 72, interact in such a way that a safe state is assumed by the safety device 100 in the event of faulty execution of the user programs 74 implementing the safety function, faulty behavior of the platform itself, or errors in communication with it. For this purpose, the monitoring device 70 safeguards the execution of the user programs 74. Accordingly, the monitoring device 70 may cooperate with a safe runtime environment 76, which is executed on the platform 68.

In the event of a fault, the monitoring device 70 can initiate—via a separate fail-safe service which is executed independently from the platform 68 according to the principle of a "watchdog"—the execution of the safety function independently of the platform 68 via the fail-safe peripheral module 72. In particular the monitoring device 70 can initiate a shutdown of the monitored technical installation or the monitored safety-critical process.

The platform 68 can be a software, hardware or virtual platform that serves as the basis for the development and execution of user programs. In particular, the platform 68 can be a non-safe platform, e.g. a single-channel system such as a standard PC. Alternatively, the platform 68 can be deployed in the form of cloud computing, particularly as Infrastructure as a Service (IaaS) or Platform as a Service (PaaS). The platform 68 may include a secure runtime environment 76. Non-safe in this context means that the non-safe platform 68 does not in itself meet the relevant safety requirements in order to perform a safety function on its own with the required degree of intrinsic safety.

The monitoring device 70 can perform a fail-safe service 78 that interacts with the platform's safe runtime environment 76 and the fail-safe peripheral module 72. The fail-safe service can, for example, implement simple technical data functions or operations that can be implemented reliably and fail-safe in hardware or software. These can be certified with little effort in accordance with the relevant safety standards. In other words, such a monitoring device can be easily approved also for high safety categories according to the relevant standards.

The monitoring device 70 is thus reduced to the necessary for the exclusive execution of at least one fail-safe service. Accordingly, the monitoring device 70 may be less complex than the safety function executing platform 68, which simplifies safety approval by the relevant authorities. The safeguarding can be independent of the safety function to be implemented. Thereby, a safety acceptance test can be carried out essentially independently of the safety function implemented in the individual scenario.

The triggering of the safety function itself can be initiated by the monitoring device 70, while the execution is left to the fail-safe peripheral module 72. A fail-safe peripheral module 72 is generally available for automation systems as standard component and is as such known from the prior art.

In order to implement high safety categories, the safe, external components need to comprise safe voltage monitoring. This can be achieved for the monitoring device 70 and the fail-safe peripheral module 72 by an apparatus 10 according to the present disclosure. In addition, the platform 68 can also be equipped with such an apparatus. Since several such apparatuses may be required for the implementation of a safety device that is divided into several components, an effective design at low cost is advantageous.

The apparatus can be identical for all three components. However, the interfaces of the apparatuses can be connected to the safety devices 100 in different ways. For example, for the monitoring device 70, the apparatus 10 for safe voltage monitoring may be directly coupled via the first interface and the second interface of the redundant processing units 80 which are present in the monitoring device 70 in order for the apparatus 10, i.e. safe voltage monitoring, to be tested in a dual-channel manner. The processing units 80 of the monitoring device 70 may include simple microcontrollers, ASICs or similar computing units, or may be composed of discrete electrical components.

In the fail-safe peripheral module 72, the apparatus 10 for safe voltage monitoring can be implemented in the same way as in the monitoring device 70. Alternatively or in addition, the apparatus 10 for safe voltage monitoring may be linked to the redundant user programs 74a, 74b instead of the integrated processing units 80 in both the monitoring device 70 and the fail-safe peripheral module 72, which in this case initiate the voltage monitoring check.

The monitoring device 70 and the fail-safe peripheral module 72 are connected to the platform 68 via a communication interface 82. This communication interface 82 does not have to be a safe communication interface, but can be designed as a simple USB interface instead.

The monitoring device 70 can be supplied with an operating voltage via a USB interface. The operating voltage in this case is the input voltage of the apparatus 10, which is converted by it into the defined output voltage for the operation of the processing units 80. In this way, the monitoring device 70 including apparatus 10 can be designed as a simple USB dongle, which does not need to include any other interfaces, at least to the outside, apart from the USB interface. The monitoring device 70, including the safe voltage monitoring, can thus be used easily and can be implemented at low cost.

Alternatively, the apparatus may use a different operating voltage, e.g. in the case of the safe peripheral module 72, the apparatus 10 may use the operating voltage used to control the safe outputs 84, usually 24 V, as input voltage.

Figure 4:
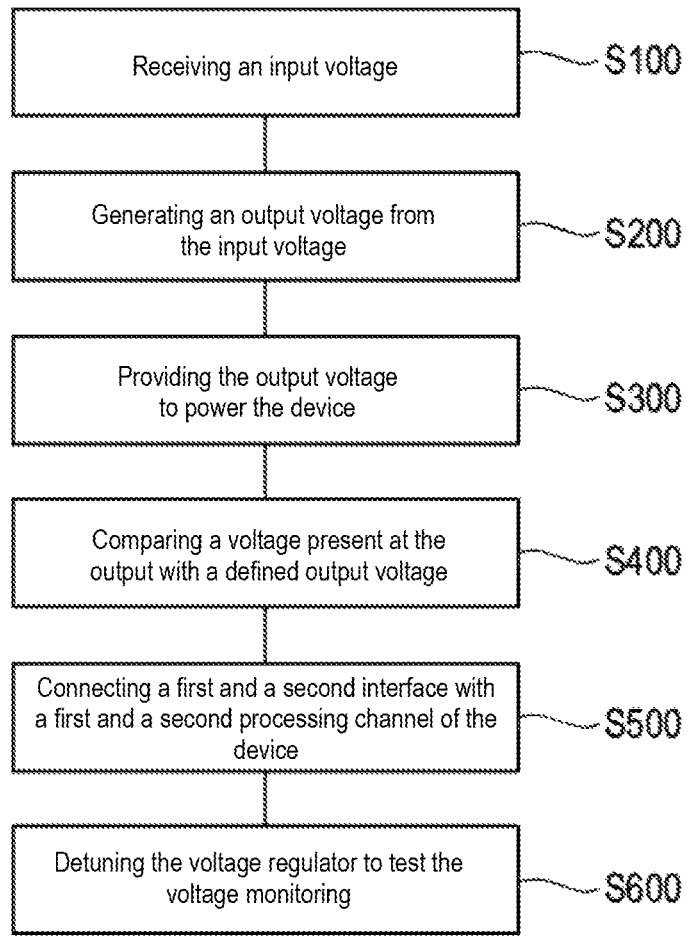
FIG. 4 shows a flowchart of an exemplary embodiment of the present method for monitoring a safety function of a machine or technical installation.

FIG. 4 shows in a flow chart the individual steps of the method for voltage monitoring of a device which implements a safety function of a machine or technical installation having at least two processing channels.

Step S100 comprises receiving an input voltage at an input. In step S200, a defined output voltage is generated from the input voltage via a voltage regulator. The output voltage is provided at an output in step S300 to power the device. Thus, according to steps S100, S200 and S300, an external operating voltage is transformed into an output voltage required for operation.

In step S400, the voltage present at the output is compared with the defined output voltage by a voltage monitor. If the voltage present at the output deviates from the defined output voltage, the output will be switched off in step S400. Thus, according to steps S300 and S400, it is ensured that either the defined output voltage is present at the output (at least within a defined tolerance range) or no output voltage is provided at the output at all.

In step S500, a first interface and a second interface are provided via which the voltage regulator is connected to the at least two processing channels of the device. The first interface and the second interface are designed in such a way that they connect a first processing channel and a second processing channel of the at least two processing channels of the device separately to the voltage regulator. In other words, it is possible to influence the voltage regulator via the two interfaces independently.

In step S600, the voltage regulator is then detuned in order to check the functionality of the voltage monitor and thus the safe voltage supply provided in steps S100 to S300.

It shall be noted that the method may include further steps and is not limited to the order of the individual steps described above.

The voltage monitoring test may also be performed cyclically as follows. With each test, an undervoltage and an overvoltage are generated in turns and it is checked to see whether an expectation is being met, e.g. by determining whether the voltage present at the output of the voltage monitor falls below a defined threshold. If yes, the voltage test is successful and the voltage regulator can be set to the operating voltage. Since the output would normally be switched off during correct operation, a capacitor can be provided which ensures that the system "lives on" for a defined period of time despite the output being switched off. The capacitor is preferably dimensioned in such a way that the system can bridge approx. 10 ms with the power supply switched off. After a test, a short time is waited until the capacitor is recharged in order to carry out the next test.

If a test was successful, normal operation can be restored. If the test was not successful, the result can be noted, for example, in EEPROMs of the microcontroller or forwarded to a higher-level unit as a diagnostic message.

What is claimed is:

1. An apparatus for voltage monitoring of a device that implements or monitors a safety function of a machine or technical installation and has at least two processing channels, comprising:
    an input for receiving an input voltage,
    a voltage regulator for generating a defined output voltage from the input voltage,
    an output for providing the defined output voltage for operation of the device,
    a voltage monitor configured to compare a voltage present at the output with the defined output voltage and to switch off the output in the event that the present voltage deviates from the defined output voltage, and
    a first interface and a second interface for connecting the voltage regulator to the at least two processing channels of the device;
    wherein the first interface and the second interface are configured to connect to a first processing channel and a second processing channel of the at least two processing channels of the device separately so that the first processing channel and the second processing channel can detune the voltage regulator independently.

2. The apparatus according to claim 1, wherein switching off the output by the voltage monitor results in execution of the safety function.

3. The apparatus according to claim 1, wherein the voltage regulator is connected to a resistor network and detuning the voltage regulator includes adjusting the defined output voltage of the voltage regulator via the resistor network.

4. The apparatus according to claim 1, wherein the apparatus further comprises a first switching element and a second switching element each operable in response to a signal present at the first interface or at the second interface, and wherein detuning of the voltage regulator is achieved by actuation of the first switching element or the second switching element.

5. The apparatus according to claim 4, wherein actuation of the first switching element and the second switching element changes the voltage present at the output by a defined amount, in particular reduces it.

6. The apparatus according to claim 4, wherein, when the first switching element is actuated and the second switching element is not actuated, the voltage regulator provides the defined output voltage, when the first switching element and the second switching element are actuated, the voltage regulator provides a defined undervoltage less than the defined output voltage, and, when the first switching element is not actuated and the second switching element is actuated, the voltage regulator provides a defined overvoltage greater than the defined output voltage.

7. The apparatus according to claim 1, wherein the apparatus further comprises a capacitor disposed at the output and configured to hold the defined output voltage for a defined period of time when the voltage monitor switches off the output.

8. The apparatus according to claim 1, wherein the apparatus further comprises a third interface and a fourth interface that are separately connectable to the first processing channel and the second processing channel and at which the voltage present at the output is accessible.

9. A device for implementing or monitoring a safety function of a machine or technical installation, in particular a safety switching device, comprising:
    a first microcontroller defining a first processing channel,
    a second microcontroller defining a second processing channel, and
    the apparatus according to claim 1.

10. The device according to claim 9, wherein the device further comprises a communication interface, in particular a USB interface, that provides an operating voltage as input voltage.

11. The device according to claim 10, wherein the implementation or monitoring of the safety function is carried out via the communication interface.

12. The device according to claim 9, wherein the device is designed as a dongle, in particular as a USB stick, and comprises a housing in which the first microcontroller and the second microcontroller are enclosed.

13. The device according to claim 9, wherein the device is a monitoring device configured to safeguard the execution of a safety function implemented by user programs on a platform, the monitoring device being connectable to the platform via a first communication interface and executing at least one fail-safe service independently of the platform, via which the monitoring device cooperates with a fail-safe peripheral module, so that the fail-safe peripheral module puts the machine or technical installation into a safe state based on the implemented safety function on the platform and the fail-safe service.

14. A method for monitoring voltage of a device that implements or monitors a safety function of a machine or technical installation and has at least two processing channels, the method comprising the steps:
    receiving an input voltage at an input;
    generating, by a voltage regulator, a defined output voltage from the input voltage;
    providing the defined output voltage at an output for the operation of the device;
    comparing a voltage present at the output with the defined output voltage by means of a voltage monitor;
    switching off the output if the voltage present at the output deviates from the defined output voltage; and
    connecting the voltage regulator to the at least two processing channels of the device via a first interface and a second interface;
wherein the first interface and the second interface connect to a first processing channel and a second processing channel of the at least two processing channels of the device separately so that the first processing channel and the second processing channel can detune the voltage regulator independently.

15. A non-transitory computer readable storage medium encoded with a computer program that, when executed by a computer processor in a device having at least two processing channels for monitoring a safety function of a machine or technical installation, causes the computer processor to execute the steps of the method according to claim 14.

* * * * *